(12) United States Patent
Liu et al.

(10) Patent No.: US 9,455,188 B2
(45) Date of Patent: Sep. 27, 2016

(54) THROUGH SILICON VIA DEVICE HAVING LOW STRESS, THIN FILM GAPS AND METHODS FOR FORMING THE SAME

(71) Applicant: GLOBALFOUNDRIES Inc., Grand Cayman, KY (US)

(72) Inventors: Huang Liu, Mechanicville, NY (US); Sarasvathi Thangaraju, Malta, NY (US); Chun Yu Wong, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 200 days.

(21) Appl. No.: 13/744,551

(22) Filed: Jan. 18, 2013

(65) Prior Publication Data

US 2014/0203446 A1  Jul. 24, 2014

(51) Int. Cl.
*H01L 23/48* (2006.01)
*H01L 21/336* (2006.01)
*H01L 21/768* (2006.01)

(52) U.S. Cl.
CPC ....... *H01L 21/76898* (2013.01); *H01L 23/481* (2013.01); *H01L 2924/0002* (2013.01)

(58) Field of Classification Search
CPC ........... H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541

USPC ....... 257/774, 621, 522, 419, 773, 758, 737, 257/499, 762, 764, 506; 438/459, 303, 591, 438/618, 421, 584, 637, 783, 763
See application file for complete search history.

(56) References Cited

U.S. PATENT DOCUMENTS

| | | | | |
|---|---|---|---|---|
| 2010/0244247 | A1* | 9/2010 | Chang | H01L 21/76898 257/741 |
| 2011/0241061 | A1* | 10/2011 | Yu et al. | 257/99 |
| 2011/0316166 | A1* | 12/2011 | Yu et al. | 257/774 |
| 2012/0013022 | A1 | 1/2012 | Sabuncuoglu et al. | |
| 2012/0043659 | A1* | 2/2012 | Li et al. | 257/751 |
| 2012/0122249 | A1* | 5/2012 | Chumakov | H01L 21/31053 438/8 |
| 2012/0276738 | A1* | 11/2012 | Hong | 438/654 |
| 2012/0292763 | A1* | 11/2012 | Filippi et al. | 257/738 |
| 2013/0001793 | A1* | 1/2013 | Yu et al. | 257/774 |

* cited by examiner

*Primary Examiner* — Selim Ahmed
*Assistant Examiner* — Moin Rahman
(74) *Attorney, Agent, or Firm* — Williams Morgan, P.C.

(57) ABSTRACT

Aspects of the present invention generally relate to approaches for forming a semiconductor device such as a TSV device having a "buffer zone" or gap layer between the TSV and transistor(s). The gap layer is typically filled with a low stress, thin film fill material that controls stresses and crack formation on the devices. Further, the gap layer ensures a certain spatial distance between TSVs and transistors to reduce the adverse effects of temperature excursion.

11 Claims, 3 Drawing Sheets

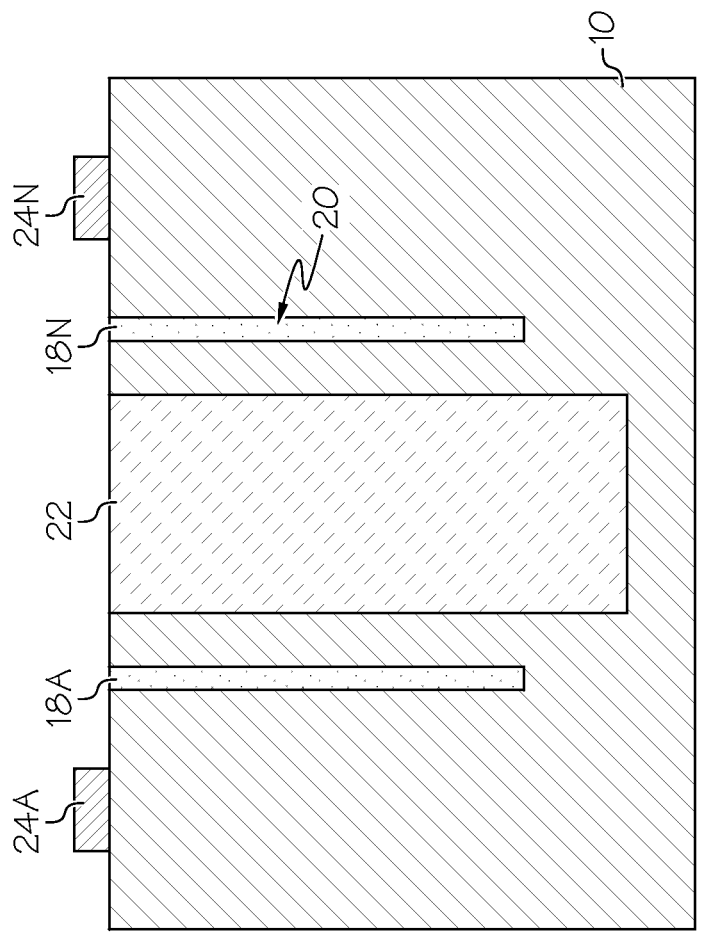
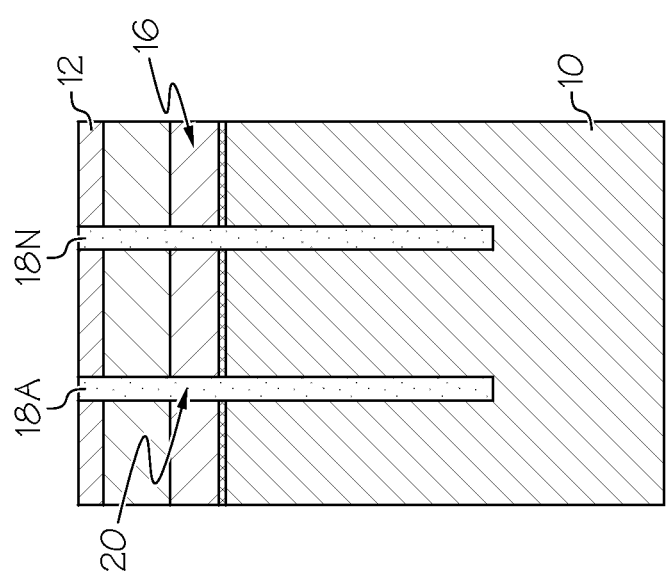

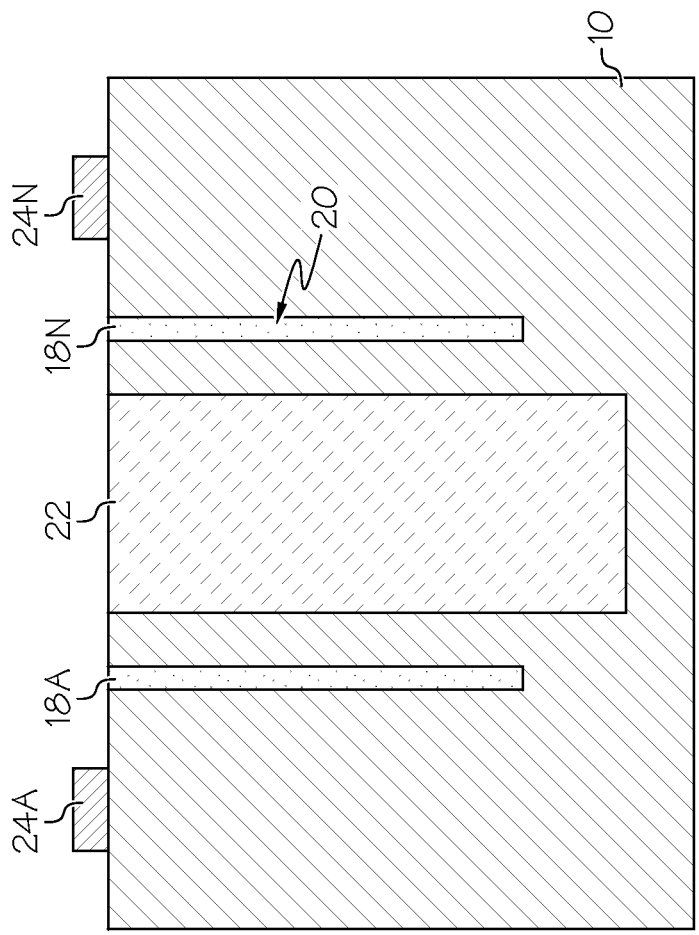
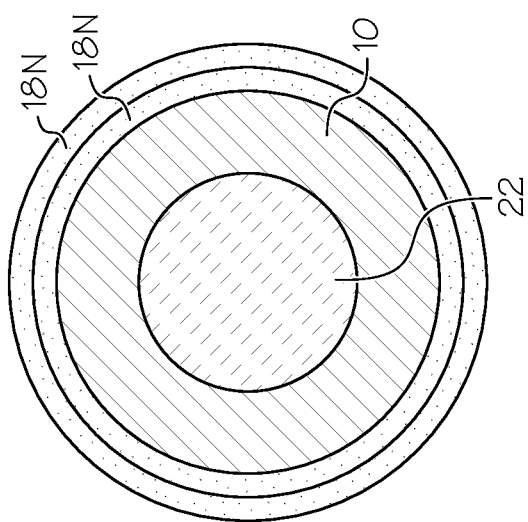
FIG. 3B
FIG. 3A

THROUGH SILICON VIA DEVICE HAVING LOW STRESS, THIN FILM GAPS AND METHODS FOR FORMING THE SAME

BACKGROUND

1. Technical Field

This invention relates generally to the field of semiconductors and, more particularly, to approaches for forming a through silicon via (TSV) device having low stress thin film gaps.

2. Related Art

During fabrication, testing, and service, packages with through silicon via (TSV) structures may undergo temperature excursion. When the operational temperature is higher than the stress-free temperature, expansion of metal within a via will induce tensile stresses (e.g., in circumferential directions) in silicon interposers due to a mismatch of coefficients of thermal expansion such that the tensile stresses could result in transistors being "squeezed" or "stretched" by adjacent TSVs resulting in performance drift. Moreover, such stresses may result in micro-cracks within the silicon dioxide ($SiO_2$) and silicon to initiate and damage the silicon interposer by radial cracking.

SUMMARY

In general, aspects of the present invention relate to approaches for forming a semiconductor device such as a TSV device having a "buffer zone" or gap layer between the TSV and transistor(s). The gap layer is typically filled with a low stress, thin film fill material that controls stresses and crack formations on the devices. Further, the gap layer ensures a certain spatial distance between TSVs and transistors to reduce the adverse effects of temperature excursion.

A first aspect of the present invention provides a method for forming a semiconductor device, comprising: forming a dielectric layer over a substrate of the semiconductor device; etching the semiconductor device to yield a set of gaps in the dielectric layer and the substrate; filling the set of gaps with a thin film fill material to yield a set of filled gaps; polishing the thin film fill material; and forming a through silicon via (TSV) in the semiconductor device, wherein the set of filled gaps is positioned proximate the TSV.

A second aspect of the present invention provides a method for forming a through silicon via (TSV) device, comprising: forming an NBLoK layer over a substrate of the TSV device; etching the TSV device to yield a set of gaps in the NBLoK layer and the substrate; filling the set of gaps with a low stress thin film fill material to yield a set of filled gaps; polishing the low stress thin film fill material to an upper surface of the NBLoK layer; and forming a through silicon via (TSV) in the TSV device, wherein the set of filled gaps are positioned proximate the TSV.

A third aspect of the present invention provides a semiconductor device, comprising: a dielectric layer formed over a substrate; a set of gaps etched in the dielectric layer and the substrate and filled with a low stress thin film fill material; and a through silicon via (TSV) formed in the semiconductor device, proximate the set of filled gaps.

BRIEF DESCRIPTION OF THE DRAWINGS

These and other features of this invention will be more readily understood from the following detailed description of the various aspects of the invention taken in conjunction with the accompanying drawings in which:

FIG. 2A shows a formation of a TSV device proximate the set of gaps according to an embodiment of the present invention.

FIG. 2B shows a formation of a TSV device proximate the set of gaps according to an embodiment of the present invention.

FIG. 3A shows a top view of a TSV device after formation according to an embodiment of the present invention.

FIG. 3B shows a cross-sectional view of a TSV device after formation according to an embodiment of the present invention.

Figure 1A:
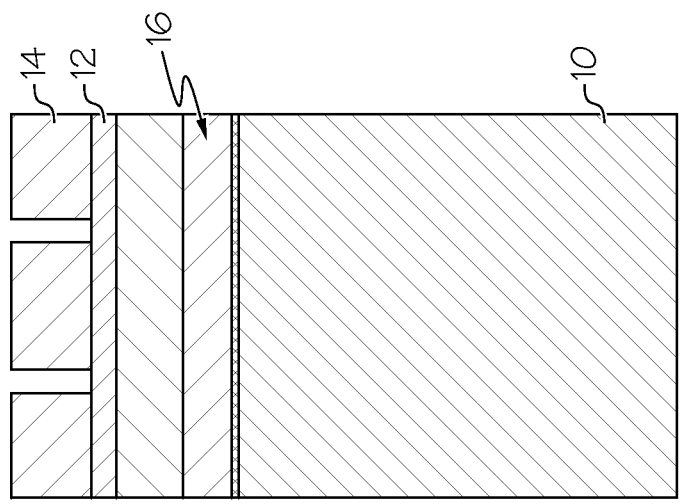
FIG. 1A shows a formation of a set of gaps in a TSV device according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below"

mean that a first element, such as a first structure (e.g., a first layer) is present on a second element, such as a second structure (e.g. a second layer) wherein intervening elements, such as an interface structure (e.g. interface layer) may be present between the first element and the second element.

A through-silicon via (TSV) is a vertical electrical connection passing completely through a silicon wafer or die. TSVs are a high performance technique used to create 3D packages and 3D integrated circuits, compared to alternatives such as package-on-package, because the density of the vias is substantially higher, and because the length of the connections is shorter.

As indicated above, aspects of the present invention generally relate to approaches for forming a semiconductor device such as a TSV device having a "buffer zone" or gap layer between the TSV and transistor(s). The gap layer is typically filled with a low stress, thin film fill material that controls stresses and crack formation on the devices. Further, the gap layer ensures a certain spatial distance between TSVs and transistors to reduce the adverse effects of temperature excursion.

Under previous embodiments, no air gaps and the like would be utilized to provide spacing between TSVs and components such as transistors. Unfortunately, air gaps and the like failed to provide for ample stress-reducing functionality, which failed to alleviate the problem.

Figure 1B:
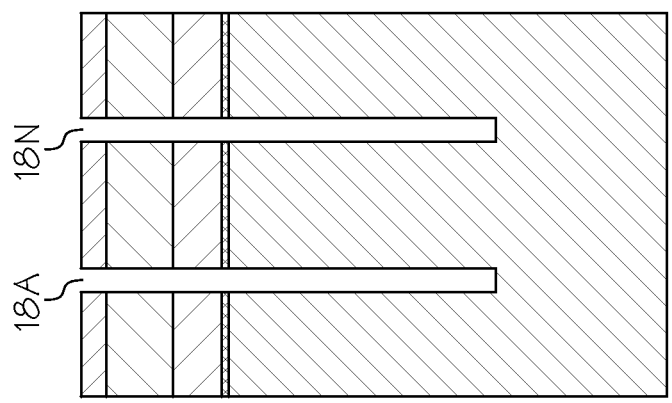
FIG. 1B shows a formation of the set of gaps in a TSV device according to an embodiment of the present invention.
Figure 1C:
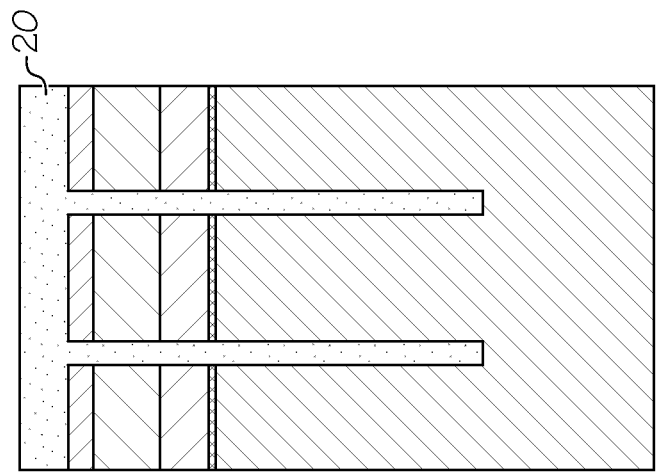
FIG. 1C shows a formation of the set of gaps in a TSV device according to an embodiment of the present invention.

Referring now to FIG. 1, the formation of low stress thin film filled gaps in a TSV device (steps I-III) according to an approach of the present invention is shown. As depicted, a silicon substrate 10 is provided over which a dielectric layer 12 (e.g., NBLoK such as $Si_wC_xN_yH_z$) is formed. Although not specifically described, other layers 16 such as a ULK layer, etc., may be interposed between substrate 10 and dielectric layer 12. In any event, in step I, a photoresist layer 14 may be applied, and lithography may be performed to yield a set of gaps (also referred to as gap layer(s)) 18A-N. Then, in step III, gaps 18A-N may be filled with a low stress, thin film fill 20.

Referring to FIG. 2, the process is continued in steps IV-V. As shown in step IV, a polishing is performed (e.g., chemical-mechanical polishing (CMP)), so that fill 20 is polished over dielectric layer 14 and gaps 18A-N to an upper/top surface of dielectric layer 12. In step V, the TSV can be formed using conventional techniques, and components such as transistors 24A-N may be positioned accordingly. In a typical embodiment, components 24A-N will be positioned such as gaps 18A-N are positioned between components 22A-N and TSV 22. This provides not only ample spacing therebetween, but also stress reduction due to the presence of fill 20 in gaps 18A-N.

Referring to FIGS. 3A-B, a top view (FIG. 3A) and cross-sectional view (FIG. 3B) of a TSV device formed according to the approaches described herein is shown. As depicted in FIG. 3A, gaps/gap layers 18A-N may be realized as concentric ring(s) around TSV 22. As further shown in FIG. 3B, transistors 24A-N are positioned beyond gaps/gap layers 18A-N with respect to TSV 22.

It is understood that the precise quantity and configuration of gaps/gap layers 18A-N, TSV 22, and/or components 24A-N is intended to be illustrative only. For example, gaps/gap layers 18A-N need not form concentric circles as long as gaps/gap layers 18A-N act as a buffer between TSV 22 and components 24A-N.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a semiconductor device, comprising:

forming a dielectric layer over a substrate of the semiconductor device;

etching the semiconductor device to yield a set of gaps in the dielectric layer and the substrate;

filling the set of gaps with a thin film fill material to yield a set of filled gaps having no sections of air located therein;

polishing the thin film fill material; and forming a recess in the substrate following the polishing of the thin film material, the recess comprising a through silicon via (TSV) in the semiconductor device between the set of filled gaps, wherein the set of filled gaps is isolated from the TSV by a portion of the substrate and the set of filled gaps comprises two or more concentric rings encircling the TSV.

2. The method of claim 1, further comprising positioning a set of transistors proximate the set of filled gaps, wherein the set of filled gaps is positioned between the set of transistors and the TSV.

3. The method of claim 1, the dielectric layer comprising an NBLoK layer.

4. The method of claim 3, the NBLoK layer comprising $Si_wC_xN_yH_z$.

5. The method of claim 1, the thin film fill material comprising a low stress material.

6. The method of claim 1, the polishing comprising polishing the thin film fill material to a top surface of the dielectric layer.

7. The method of claim 1, further comprising a device formed according to the method of claim 1.

8. A method for forming a through silicon via (TSV) device, comprising:
    forming an NBLoK layer over a substrate of the TSV device;
    etching the TSV device to yield a set of gaps in the NBLoK layer and the substrate;
    filling the set of gaps with a thin film fill material to yield a set of filled gaps;
    polishing the low stress thin film fill material to expose an upper surface of the NBLoK layer; and
    forming a recess in the substrate following the polishing of the thin film material, the recess comprising a through silicon via (TSV) in the semiconductor device between the set of filled gaps, wherein the set of filled gaps is isolated from the TSV by a portion of the substrate and the set of filled gaps comprises two or more concentric rings encircling the TSV.

9. The method of claim 8, further comprising positioning a set of transistors proximate the set of filled gaps, wherein the set of filled gaps are positioned between the set of transistors and the TSV.

10. The method of claim 8, the NBLoK layer comprising $Si_wC_xN_yH_z$.

11. The method of claim 8, further comprising a device formed according to the method of claim 8.

* * * * *